United States Patent
Maeda et al.

(10) Patent No.: US 6,432,839 B2
(45) Date of Patent: *Aug. 13, 2002

(54) FILM FORMING METHOD AND MANUFACTURING METHOD OF SEMICONDUCTOR DEVICE

(75) Inventors: Kazuo Maeda; Noboru Tokumasu; Yuki Ishii; Toshiro Nishiyama, all of Tokyo (JP)

(73) Assignees: Canon Sales Co., Inc.; Semiconductor Process Laboratory Co., Ltd., both of (JP)

( * ) Notice: Subject to any disclaimer, the term of this patent is extended or adjusted under 35 U.S.C. 154(b) by 0 days.

This patent is subject to a terminal disclaimer.

(21) Appl. No.: 09/804,142

(22) Filed: Mar. 13, 2001

(30) Foreign Application Priority Data

Mar. 31, 2000 (JP) ........................................ 2000-098263

(51) Int. Cl.⁷ ............................................... H01L 21/31

(52) U.S. Cl. ...................... 438/758; 438/623; 438/789; 438/790; 438/760

(58) Field of Search ................................ 483/758, 760, 483/396, 789, 790, 623; 257/754, 750

(56) References Cited

U.S. PATENT DOCUMENTS

| | | | |
|---|---|---|---|
| 4,708,884 A | 11/1987 | Chandross et al. | 427/39 |
| 5,409,743 A | 4/1995 | Bouffard et al. | 427/579 |
| 5,915,200 A | 6/1999 | Tokumasu et al. | 438/623 |
| 6,271,150 B1 * | 8/2001 | Croswell et al. | 438/761 |
| 6,274,932 B1 * | 8/2001 | Mikagi | 257/754 |
| 6,289,843 B1 * | 9/2001 | Gupta et al. | 118/723 E |
| 6,291,028 B1 * | 9/2001 | Gupta et al. | 427/564 |
| 6,294,438 B1 * | 9/2001 | Arita et al. | 438/396 |

FOREIGN PATENT DOCUMENTS

| | | |
|---|---|---|
| EP | 0 339 385 | 4/1989 |
| EP | 0 562 625 A2 | 3/1993 |
| JP | 4-320338 | 11/1992 |
| JP | 7-153696 | 6/1995 |

OTHER PUBLICATIONS

D.W. Williams et al., J. Electrochem. Soc.: Solid–State Science and Technology, Mar. 1987, pp. 657–664.

R.M. Levin et al., J. Vac. Sci. Technol. B1(1), Jan.–Mar., 1983, pp. 54–61.

J. Sato et al, Washington D.C. Meeting, col. 118, No. 3, pp. 31–33, May, 1971.

* cited by examiner

Primary Examiner—John F. Niebling
Assistant Examiner—Olivia T Luk
(74) Attorney, Agent, or Firm—Lorusso & Loud

(57) ABSTRACT

The invention is a method for forming a flattened interlayer insulating film covering a wiring layer or the like of a semiconductor IC device, and a method of manufacturing a semiconductor device. The film-forming method includes the steps of preparing a deposition gas containing an inert gas, and a silicon and phosphorus-containing compound having III valence phosphorus in which at least one oxygen is bonded to the phosphorous, and forming a silicon containing insulating film containing $P_2O_3$ on a substrate by using the deposition gas.

15 Claims, 9 Drawing Sheets

(Note) Any one of O₂ annealing and steam annealing among above annealing processes can be omitted (Note)
Any one of O₂ annealing and steam annealing among above annealing processes can be omitted

FILM FORMING METHOD AND MANUFACTURING METHOD OF SEMICONDUCTOR DEVICE

BACKGROUND OF THE INVENTION

1. Field of the Invention

The present invention relates to a method for forming a flattened interlayer insulating film to cover the wiring layer or the like of a semiconductor integrated circuit device, and a method for manufacturing a semiconductor device.

2. Description of the Prior Art

In recent years, within the field of semiconductor integrated circuit devices (hereinafter, referred to as a semiconductor IC device), progress has been made toward achieving a much higher density, and an increasing number of such devices have multilayer wiring, i.e., wiring extended over several layers. In such a case, because of the frequent use of, especially, an aluminum material for the wiring, a need has developed for a method for forming a flattened interlayer insulating film at a low temperature of 500° C. or lower.

Conventionally, flattening methods include: that shown in FIG. 1, which performs flattening by forming a film by a thermal chemical vapor deposition method (hereinafter, referred to as a TH-CVD method); a plasma enhanced chemical vapor deposition method (hereinafter, referred to as a PE-CVD method) or the like, heating the formed film, and then fluidizing the film; the etch back method shown in FIG. 2; and the chemical mechanical polishing method (hereinafter, referred to as a CMP method) shown in FIG. 3, which removes unevenness on the surface of the insulating film by etching or polishing.

In the case of the former method, as shown in FIG. 1A, a boro-phospho silicate glass film (hereinafter, referred to as a BPSG film) 4 is formed by a TH-CVD method, which uses any one of the following deposition gases:

(1) $SiH_4+PH_3+B_2H_6+O_2$ ($PH_3$: phosphine)
(2) TEOS+TMOP+TMB or TEB+$O_2$ or $O_3$ (TEOS: tetraethylorthosilicate ($Si$-$(OC_2H_5)_4$), TMOP: trimethylphosphate ($PO(OCH_3)_3$)).

Alternatively, as shown in FIG. 1A, a BPSG film 4 is formed by a PE-CVD method, which uses any one of the following deposition gases:

(1) $SiH_4+PH_3+B_2H_6+O_2$
(2) TEOS+TMOP+TMB or TEB+$O_2$.

For reference, see: J. Electrochem. Soc., 134.3,: 657, 1987, by Williams, D. S. and Dein, E. A; J. Vac.Sci. Technol., B1, 1:54, 1983, by Levin, R. M. and Evans-Lutterodt, K; Extended Abstract of Electrochem. Soc. Spring Meeting: 31, 1971, by Sato, J. and Maeda, K.

Then, as shown in FIG. 1B, the formed BPSG film 4 is heated to a temperature of about 850° C., and thereby fluidized and flattened. In the case of a phospho-silicate glass film (hereinafter, referred to as a PSG film), a film is formed by a TH-CVD method, a PE-CVD method or the like, which uses the foregoing deposition gas minus the boron containing gas ($B_2H_6$, TMB or TEB), which film is then heated to a temperature of 1000° C. or lower, and thereby fluidized and flattened.

In the case of the latter method, as shown in FIG. 2A and FIG. 3A, firstly, a non-doped silicate glass (hereinafter, referred to as a NSG film) 5 is formed by a TH-CVD method, a PE-CVD method or the like, which uses one of the following deposition gases, and then flattened:

(1) $SiH_4+O_2$ (TH-CVD method or PE-CVD method)
(2) TEOS+$O_2$ or $O_3$ (TH-CVD method)
(3) TEOS+$O_2$ (PE-CVD method)

In the etch back method, as shown in FIG. 2B, a resist film 6 is formed on the NSG film 5 by a coating method, and then, as shown in FIG. 2C, the film 6 is subjected to etching to form a flattened NSG film 5*a*. In the CMP method, as shown in FIG. 3B, the NSG film 5 is formed, and then polished to flatten the surface and form a flattened NSG film 5*b*.

In FIGS. 1 to 3, reference numeral 1 denotes a semiconductor substrate; 2 a base insulating film; and 3*a* and 3*b* wiring layers formed on the base insulating film 2.

Incidentally, the above-described flattening methods based on the etch back method or the CMP method are effective, especially when a low temperature is required, because these methods can be executed without heating, unlike the case of flattening by heating to fluidize. However, as shown in FIGS. 2A–2C, 3A and 3B, if any voids or recesses are formed between the wires 3*a* in the insulating film 5, the voids and recesses are left unchanged even after flattening. Currently available methods for forming insulating films having good gap-filling capabilities include a high-density PE-CVD method, a PE-CVD method, an atmospheric pressure TH-CVD method, an spin-on-glass (hereinafter, referred to as SOG) coating method, and the like. However, since these flattening methods do not use thermal fluidity, particularly when a high densification is attained by narrowing the spaces between the wiring, recesses cannot be completely filled.

On the other hand, in the flattening method based on fluidizing by heating, since thermal fluidity is utilized, as shown in FIG. 1, complete filling can be expected. At present, the BPSG film 4 is frequently used for such a purpose. However, heating to at least a temperature of 850° C. must be carried out for fluidization. Thus, such a film cannot be applied to the base film 2 of the wiring 3*a* and 3*b* or the interlayer insulating film 4, where a low temperature is needed for formation. In particular, the film cannot be applied to an insulating film to cover the aluminum wiring layer. In this case, the temperature of fluidization can be somewhat lowered by increasing the concentration of boron or phosphorus. Even so, the temperature is not sufficiently low. Rather, new problems may occur, such as a reduction in the stability or humidity resistance of the insulating films 2 and 4. Similar problems may occur in the case of a PSG film, because a temperature of fluidization substantially equal to that for the BPSG film is necessary.

As an insulating film having a low fluidization temperature, a GeBPSG film formed by adding $GeO_2$ to the BPSG film has been developed. However, the temperature cannot be lowered below about 750° C. Thus, it is difficult to apply this film to a base film or an interlayer insulating film, for which a much lower temperature is required.

SUMMARY OF THE INVENTION

The fluidization temperature is preferably as low as possible, not only when aluminum, copper or the like is used for wiring in a semiconductor large scale integrated circuit (hereinafter, referred to as LSI) or the like, but also to prevent re-distribution of impurities from an impurity introduction region which is generally caused by heat.

An object of the present invention is to provide a method for forming an insulating film, capable of greatly reducing the fluidization temperature for flattening a surface, and a manufacturing method for a semiconductor device.

The inventors focused on the following points:
(1) the BPSG film or the phospho-silicate glass film (hereinafter, referred to as PSG film) is conventionally formed from a mixture of $SiO_2+P_2O_5+B_2O_3$, or of $SiO_2+P_2O_5$ (the $PH_3$ of the deposition gas $SiH_4+PH_3+B_2H_6+O_2$ is III valance phosphorus, and bonds with externally supplied oxygen to generate, not $P_2O_3$, but $P_2O_5$. This may be attributed to the fact that since $PH_3$ itself contains no oxygen, when it is bonded with externally supplied oxygen, stable $P_2O_5$ is easily generated.);
(2) in the BPSG film of $P_2O_5$—$SiO_2$, a eutectic point for the composition of 20 to 80% of $P_2O_5$ is theoretically 850° C., and its fluidization temperature is dependent on the melting point of the $P_2O_5$ itself; and
(3) $P_2O_3$ has a melting point much lower than that of $P_2O_5$ as shown in Table 1.

TABLE 1

| | Melting point | Boiling point |
|---|---|---|
| $P_2O_3$ (III valance) | 23.8° C. | 175.4° C. |
| $P_2O_5$ (V valance) | 580 to 585° C. | 300° C. (sublimation) |

(CRC Handbook of Chemistry: 1978/88 edition, by CRC press)

Accordingly, the inventors theorized that the fluidization temperature would be lowered if the BPSG film or the PSG film contains mainly $P_2O_3$, instead of $P_2O_5$.

Accordingly, the present invention oxidizes a phosphorus containing compound in an oxygen deficient atmosphere to form a BPSG or PSG film having a high concentration of $P_2O_3$. The method may use, as a deposition gas, (1) a silicon and phosphorus-containing compound, wherein the phosphorus atom (P atom) is in the III valance form; or (2) a silicon containing compound or a silicon and phosphorus-containing compound containing oxygen, without addition of any oxygen or ozone.

The silicon and phosphorus-containing compound, containing a III valance P atom, may be selected from silicon and phosphorus-containing compounds having the following structural formulas:

A PSG film or the like was formed by using deposition gas containing the silicon and phosphorus-containing compound, and by a TH-CVD method or a PE-CVD method, and the composition of the formed film was determined by X-ray fluorescence analysis (XRF) or Fourier transform infrared spectroscopy (FTIR). The presence of high-concentration $P_2O_3$ in the formed film was verified. Then, a fluidization temperature of 700° C. or lower was obtained. Further, it was found that it is possible to adjust a fluidization temperature by controlling a concentration of $P_2O_3$.

The inventors also found that it is possible to easily adjust concentration of $P_2O_3$ by controlling the deposition temperature and the gas flow rate of the silicon and phosphorus-containing compound (flow rate of inert gas carrier), or by controlling the concentration of oxidizing gas when an oxidizing gas is added.

If nitrogen ($N_2$) is used as carrier gas for the silicon and phosphorus-containing compound, since $N_2$ is a diatomic molecule, when a film is formed by reaction of plasma enhanced vapor deposition, it is assumed that the $N_2$ dissociates and bonds with hydrogen in the film to form ammonia ($NH_3$) in the film. Accordingly, the present invention uses an inert gas, e.g., argon or helium, as the carrier gas. Because of the low reactivity of argon or helium, the amount of ammonia in the film can be reduced to substantially zero.

Further, the use of inert gas, e.g., argon or helium, as the carrier gas, results in a great reduction in the concentration of phosphorus during heat treatment after deposition, enhancing controllability of the concentration of phosphorus.

In addition, by forming a film using only the silicon and phosphorus-containing compound, containing III valance phosphorus, the amount of carbon left in the formed film can be greatly reduced. In this case, the adjustment of a phosphorus concentration can be made by controlling the ratio of flow rates of the silicon and phosphorus-containing compound and the foregoing inert gas in the deposition gas. Accordingly, in contrast to the prior art wherein a silicon containing compound containing no phosphorus is added in the deposition gas in order to adjust a phosphorus concentration, the present invention eliminates the silicon compound containing no phosphorus from the deposition gas. The silicon compound containing no phosphorus has Si—C bonds, causing carbon to be left during deposition. Thus, preferably, the addition of such a compound should be as little as possible, but can be added as occasion demands.

Furthermore, the film that has been formed as described above is subjected to nitrogen annealing and oxygen annealing, and then heated in an atmosphere containing moisture. This process is called steam annealing. Since the steam annealing has an oxidizing force stronger than that of normal oxygen annealing, residual III valance phosphorus is oxidized, and the moisture absorption resistance of the formed film is enhanced, thus improving film quality.

The foregoing can be established similarly for the BPSG film.

DESCRIPTION OF THE PREFERRED EMBODIMENTS

Next, the preferred embodiments of the present invention will be described with reference to the accompanying drawings.

(1) First Embodiment

A PSG film is formed by a series of steps including a film-forming step according to a first embodiment of the present invention.

Figure 8:
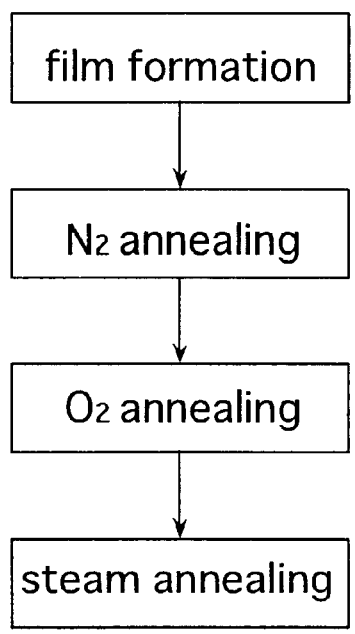
FIG. 8 is a flowchart showing the film-forming method of the second embodiment of the present invention.

As shown in FIG. 8, the series of steps includes, a film-forming step, a $N_2$ annealing step, an $O_2$ annealing step, and a steam annealing step.

The deposition gas used in the film-forming step was formed by mixing a silicon and phosphorus-containing compound, inert gas and an oxidizing gas. Silicon containing compounds containing no phosphorus should not be used.

The phosphorus containing compound can be selected from silicon and phosphorus-containing compounds having Si—O—P structures, for which structural formulas are shown below:

(i) phosphorus acid dimethyl trimethylsilylester (referred to as SOP-11 (a), hereinafter);

(ii) phosphorous acid dimethoxy trimethylsilylester (referred to as SOP-11 (b), hereinafter);

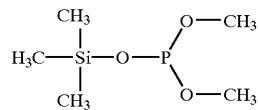

(iii) P (Osi(Ch$_3$)$_3$)$_3$; or

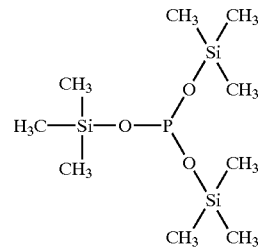

(iv) P (Osi(Ch$_3$)$_3$)$_2$.

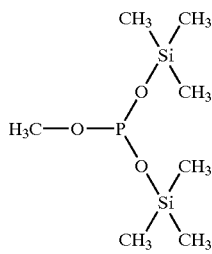

Instead of the above, a silicon and phosphorus-containing compound having III valance phosphorus, and oxygen being bonded to at least one of the valances of the phosphorus, can be used. In the described embodiment, SOP-11 (b) was used.

The inert gas added to the silicon and phosphorus-containing compound may be argon (Ar) or helium (He). In this first embodiment, argon (Ar) was used as the inert gas.

It is not always necessary to include oxidizing gas in the deposition gas. However, when included, ozone ($O_3$), oxygen ($O_2$), NO, $N_2O$, $NO_2$, CO, $CO_2$, $H_2O$, or the like can be used as the oxidizing gas. In this first embodiment, oxygen ($O_2$) is used as oxidizing gas.

As occasion demands, a silicon containing compound containing no phosphorus may be added to the deposition gas. Such a silicon containing compound can be selected from alkylsilanes and arylsilanes (general formula $R_nSiH_{4-n}$ (n=1 to 4)) alkoxysilanes (general formula (RO)$_nSiH_{4-n}$ (n=1 to 4)), chain siloxanes (general formula $R_nH_{3-n}SiO$ ($R_kH_{2-k}SiO$)$_mSiH_{3-n}R_n$ (n=1 to 3; k=0 to 2; m∞0)), derivatives of cyclic siloxanes (general formula (RO)$_nH_{3-n}SiOSiH_{3-n}$ (OR)$_n$ (n=1 to3), chain siloxanes (general formula ($R_kH_{2-k}SiO$)$_m$ (k=1, 2; m∞2)), and the like. In the above, R is an alkyl group, an aryl group or its derivative.

Compounds containing silicon, but not phosphorus, are mainly as follows:

(i) hexamethyl disiloxane (HMDSO): $(CH_3)_3SiOSi(CH_3)_3$);

(ii) tetramethyl disiloxane (TMDSO): $H(CH_3)_2SiOSi(CH_3)_2H$);

(iii) hexaethyl disiloxane (HEDSO): $(C_2H_5)_3SiOSi(C_2H_5)_3$);

(iv) tetraethyl orthosilicate (TEOS: $Si(OC_2H_5)_{:4}$);

(v) triethoxy silane (TRIES: $HSi(OC_2H_5)_3$); and (vi) trimethoxy silane (TMS: $HSi(OCH_3)_3$).

In the steam annealing step, oxygen and hydrogen are mixed in a predetermined ratio and reacted to generate water molecules, and heating is carried out in an atmosphere containing the water molecules.

Conditions for a series of steps are described below. Standard processing conditions are shown in tables. Processing parameters having conditions varied to obtain comparison data are described outside the tables.

(i) Deposition Conditions

TABLE 2

| Deposition | Standard set value |
| --- | --- |
| Substrate temperature | 250° C. |
| RF power | 150 W |
| Total gas flow rate | 1.0 slm |
| Amount of added $O_2$ | 2 sccm |

The substrate temperature was changed to 100, 200, and 300° C. Since SOP-11(b) is liquid at room temperature, it is entrained in a carrier. gas by bubbling the carrier gas therethrough. The inventors prepared two kinds of deposition gases, i.e., one using Ar as the carrier gas, and one using $N_2$ as the carrier gas. When inert gas (Ar) was used as the carrier gas, the content of SOP-11(b) in deposition gas was adjusted by controlling the flow rate of the carrier gas.

(ii) $N_2$ Annealing

TABLE 3

| Processing | Standard set value |
| --- | --- |
| Temperature rising rate | 10° C./min. |
| $N_2$ gas flow rate | 10 slm |
| Holding temperature | 650° C. |
| Holding time | 15 min. |

For comparison, the heat treatment temperature was changed to 250, 500, and 750° C. In addition, similar processing was carried out for a film formed using $N_2$ instead of Ar in the deposition gas.

(iii) O$_2$ Annealing

TABLE 4

| Processing | Standard set value |
|---|---|
| O$_2$ gas flow rate | 10 slm |
| Holding temperature | 650° C. |
| Holding time | 15 min. |

(iv) Steam Annealing

TABLE 5

| Processing | Standard set value |
|---|---|
| O$_2$ gas flow rate | 6 slm |
| H$_2$ gas flow rate | 5 slm |
| Holding temperature | 650° C. |
| Holding time | 15 min. |

Either the O$_2$ annealing or the steam annealing can be omitted.

Figure 1A:
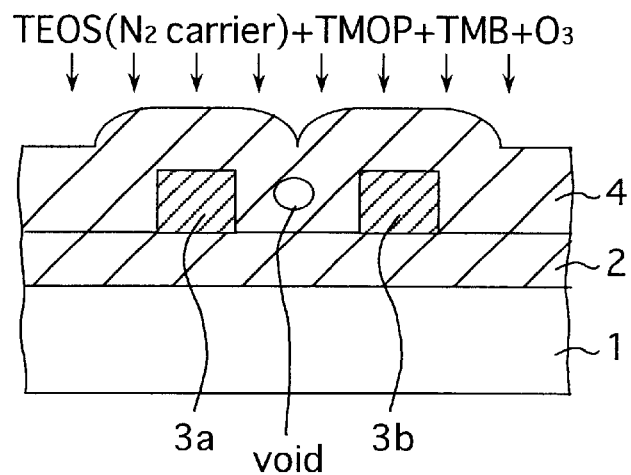
FIGS. 1A and 1B are sectional views showing a conventional method for forming an interlayer insulating film, which includes flattening by fluidization with heating.
Figure 1B:
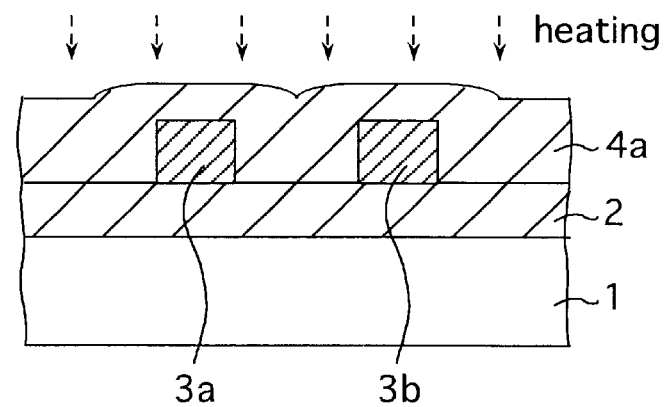
Figure 2A:
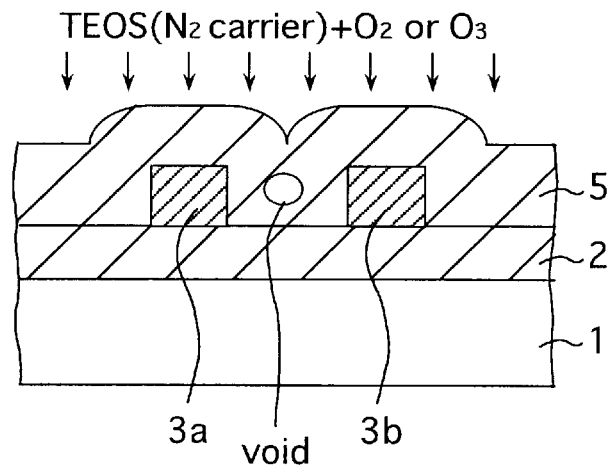
FIGS. 2A to 2C are sectional views showing a conventional method for forming an interlayer insulating film, which includes flattening by etch back.
Figure 2B:
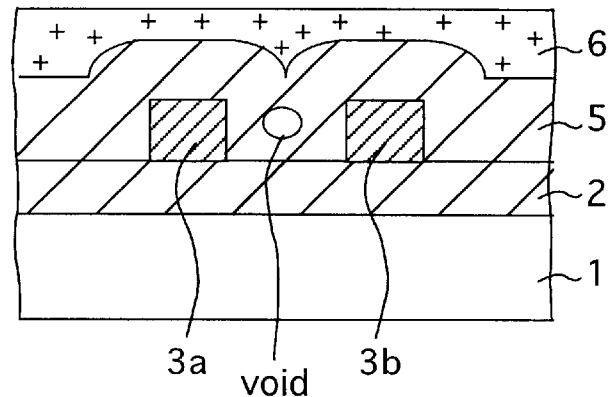
Figure 2C:
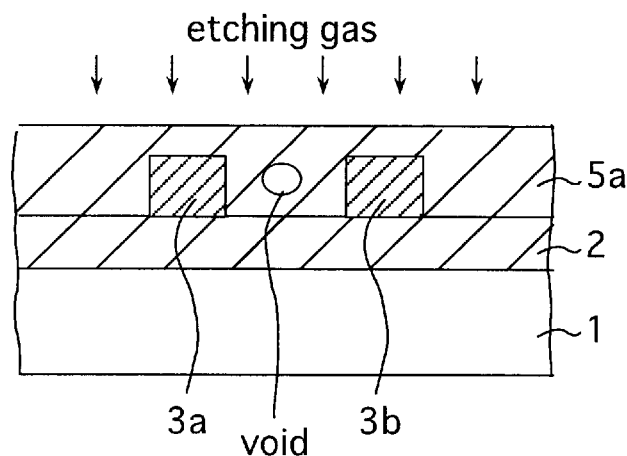
Figure 3A:
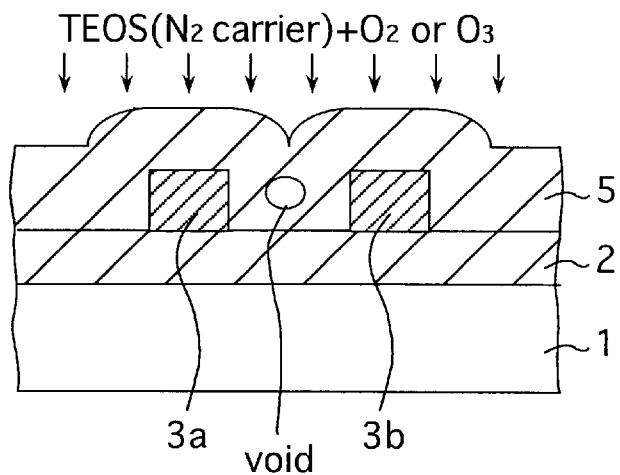
FIGS. 3A and 3B are sectional views showing a conventional method for forming an interlayer insulating film, which includes flattening by CMP.
Figure 3B:
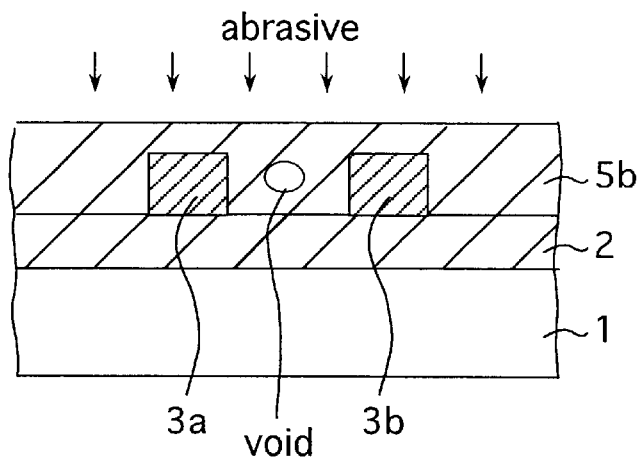
Figure 4A:
FIGS. 4A to 4D are sectional views showing a method for forming a PSG film, which comprises a series of steps including a film-forming step, according to a first embodiment of the present invention.
Figure 4A:
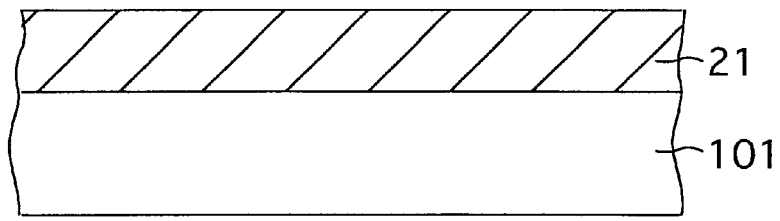

First, a substrate 101 shown in FIG. 4A is placed in the chamber of a PE-CVD apparatus. Then, the substrate is heated to maintain a specified substrate temperature.

Subsequently, the foregoing deposition gas is introduced into the chamber, and a plasma is generated and maintained for a predetermined time. In this way, a PSG film 21 having a specified thickness and containing a high-concentration of P$_2$O$_3$ is formed. In this case, depending on the concentration of P$_2$O$_3$ or the ratio of P$_2$O$_3$/P$_2$O$_5$, the PSG film 21 may be fluidized at a temperature substantially equal to the substrate temperature during film formation. Accordingly, flattening is achieved simultaneously with the film formation.

Figure 4B:
Figure 4B:
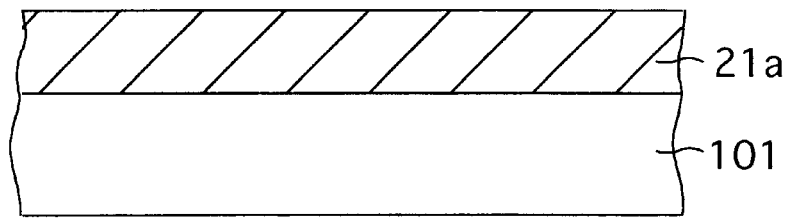

Then, as shown in FIG. 4B, after the formation of the PSG film 21 on the substrate 101, heating for flattening is carried out in a N$_2$ atmosphere. PSG film 21a is thereby fluidized and flattened.

Figure 4C:
Figure 4C:
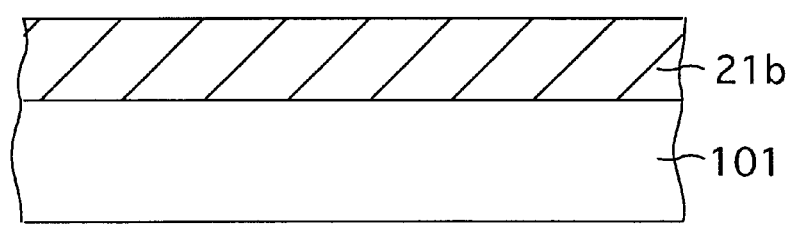

Then, as shown in FIG. 4C, heating is carried out in atmosphere containing oxygen. In this way, P$_2$O$_3$ in PSG film 14a is oxidized and converted to P$_2$O$_5$. As a result, the P$_2$O$_5$ concentration in PSG film 21b is increased to thereby stabilize the PSG film 14a.

Figure 4D:
Figure 4D:
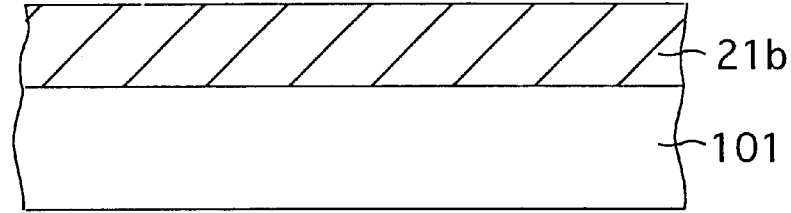

Then, as show[008e] in FIG. 4D, heating is carried out in an atmosphere containing moisture. Because the moisture is highly oxidizing, the conversion of P$_2$O$_3$ to P$_2$O$_5$ is further promoted. Accordingly, the P$_2$O$_5$ concentration in the PSG film 21b becomes much higher.

Figure 5:
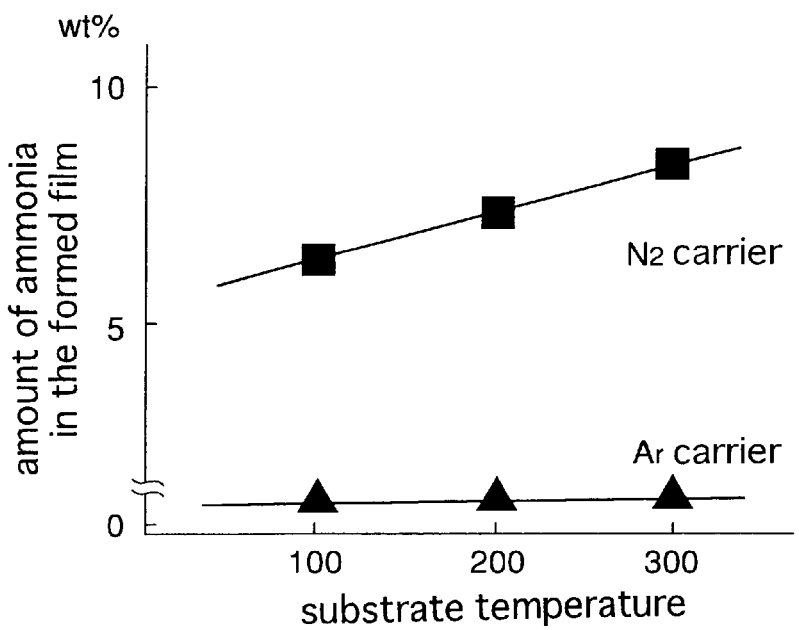
FIG. 5 is a graph showing dependence of the amount of ammonia in the PSG film formed by the film-forming method of the first embodiment of the present invention on the substrate temperature.

With regard to the PSG film 21 formed in the above film-forming method, the amount of ammonia in the film immediately after its formation was also examined and the results of the examination are shown in FIG. 5. Specifically, FIG. 5 shows the dependence of the amount of ammonia in the formed film after film formation on the substrate temperature during film formation. In FIG. 5 the ordinate shows the amount of ammonia (wt. %) in the formed film, expressed in linear scale and the abscissa shows the substrate temperature (° C.) expressed in linear scale.

In the examination, a sample is subjected to thermal desorption spectroscopy (TDS) analysis, thermally desorbed ammonia gas is quantitatively measured, and then comparison is made.

As can be understood from the result of FIG. 5, there are differences in the tendency of dependence and contents between the case of using Ar as. carrier gas and the case of using N$_2$ as the same. When the carrier gas is Ar, the substrate temperature is not affected, and little ammonia is contained in the formed film. When the carrier gas is N$_2$, the content of ammonia 5 wt. % or higher, and the content increased corresponding to the increase of the substrate temperature.

Concentration of phosphorus in the formed film was examined by means of X-ray fluorescence analysis (XRF). By the XRF, a total concentration of P$_2$O$_3$+P$_2$O$_5$ in the formed film can be detected.

Figure 6:
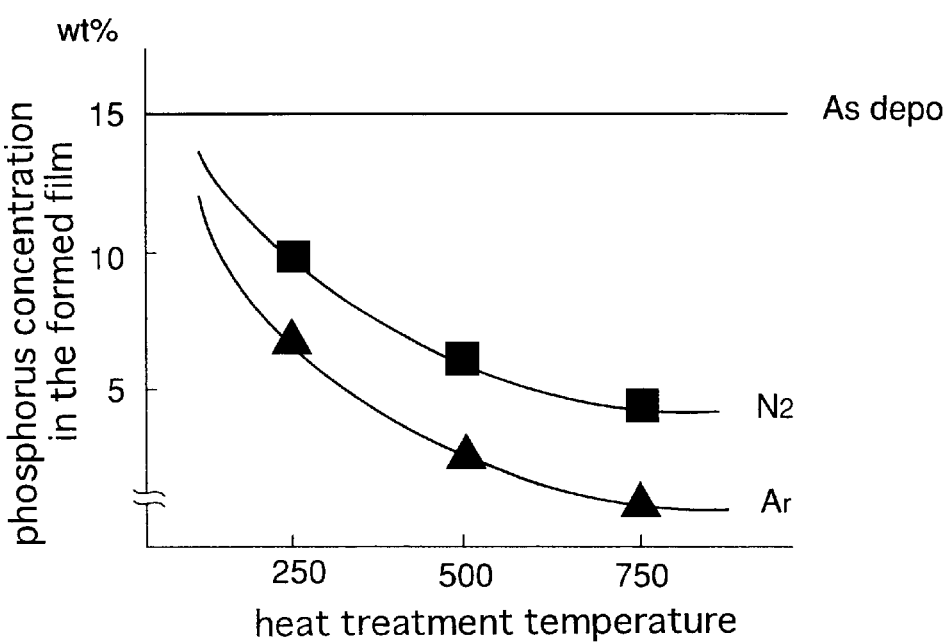
FIG. 6 is a graph showing the relationship between phosphorus concentration in the PSG film formed by the film-forming method of the first embodiment of the present invention, and the temperature of annealing after film formation.

The result of analysis is shown in FIG. 6. Specifically, FIG. 6 shows the dependence of phosphorus concentration in the formed Film 21a on the temperature of N$_2$ annealing after film formation, in which the ordinate shows the P concentration (wt. %) in the PSG film, and the abscissa axis shows the heat treatment temperature (° C.), expressed in linear scale. "As depo" denotes a concentration of phosphorus in the PSG film 21 immediately after film formation and before N$_2$ annealing.

As can be understood from FIG. 6, there is a difference in the concentration of P$_2$O$_3$ or in the ratio of P$_2$O$_3$/P$_2$O$_5$ in the formed PSG film 21a between the case of using Ar as carrier gas and the case of using N$_2$ as the same. The concentration of P$_2$O$_3$ or the ratio of P$_2$O$_3$/P$_2$O$_5$ can be reduced more when Ar is used as the carrier gas than when N$_2$ is used as the same. For both cases, it was discovered that the concentration of phosphorus can be adjusted by a heat treatment temperature.

In addition, the melting temperature or fluidization temperature of the PSG film 21a for each of the above cases becomes lower as the concentration of P$_2$O$_3$ or the ratio of P$_2$O$_3$/P$_2$O$_5$ becomes higher. In the experiment, a melting temperature or a fluidization temperature of 700° C. or lower was obtained.

Figure 7:
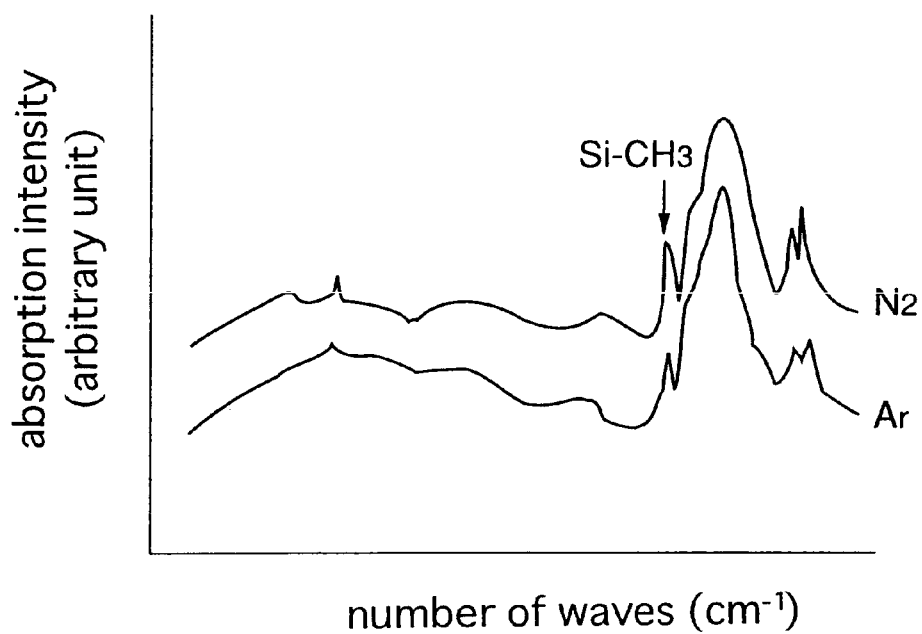
FIG. 7 is a graph showing the amount of carbon in the PSG film formed by the film-forming method of the first embodiment of the present invention.

Further, FIG. 7 shows the result of examining the amount of Si—CH$_3$ bonding, i.e., carbon content, in the formed film 21b. Specifically, the ordinate of FIG. 7 shows absorption intensity (arbitrary unit) by Fourier transform infrared spectroscopy (FTIR), while the abscissa shows the wave number (cm−1).

According to the results shown in FIG. 7, the content of Si—CH$_3$ bonding in the formed film 21b varies between the case of using Ar as carrier gas and the case of using N$_2$ as the same. In other words, the peak height of an absorption intensity is lower in the case of using Ar as carrier gas than that in the case of using N$_2$ as the same, and thus the content of Si—CH$_3$ bonding in the formed film 21b is smaller.

As apparent from the foregoing, according to the first embodiment of the present invention, since a phosphorus containing compound, which contains III valance phosphorus, is used for the deposition gas, it is possible to form a PSG film having a high P$_2$O$_3$ content immediately after film formation. Accordingly, the PSG film can be fluidized at a low temperature.

Moreover, an inert gas, e.g., argon or helium, is used as carrier gas in the deposition gas. Because of the low reactivity of argon and helium, the amount of ammonia in the formed film can be set to substantially zero. Thus, the quality of the formed film can be improved.

(2) Second Embodiment

A PSG film containing P$_2$O$_3$ is formed by means of a PE-CVD method according to a second embodiment of the present invention.

FIG. 8 is a flowchart showing a film-forming method according to the second embodiment of the invention. FIGS. 9A to 9F are sectional views illustrating the film-forming method of the second embodiment of the present invention.

As a deposition gas, a mixed gas of SOP-11(b)+Ar was used. To establish oxygen deficiency, no oxygen (O$_2$) was added thereby differing from the first embodiment.

As a film-forming method, a PE-CVD method using a film forming apparatus having well-known parallel plate type electrodes was used. The plasma enhanced method involves applying RF power between upper and lower electrodes placed opposing each other, and then converting the deposition gas between these electrodes into a plasma. The lower electrode serves also as a substrate holder and, as occasion demands, power for substrate biasing may be applied to the lower electrode.

The deposition conditions were as described below.

TABLE 6

| Deposition parameter | Deposition condition |
| --- | --- |
| SOP-11(b) (bubbling by Ar) | 0.1 to 2 slm |
| Ar | 0.1 to 1 slm |
| Substrate temperature | 20 to 400° C. |
| Pressure range | 66 to 2667 Pa |
| RF power | 100 to 700 w |
| Frequency | 13.56 MHZ |
| Substrate bias power | 0 to 300 w |
| Frequency | 13.56 MHz or 400 kHz |

Figure 9A:
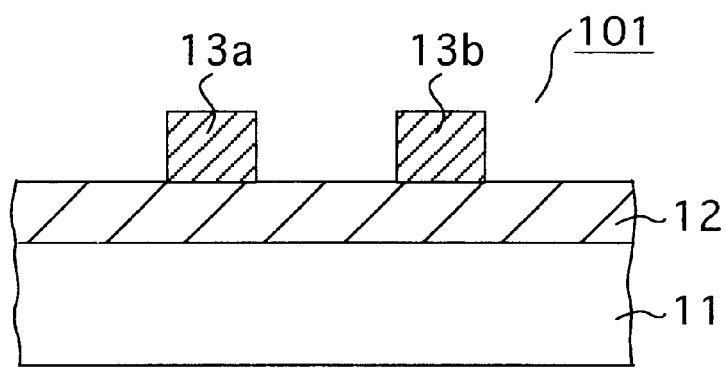
FIGS. 9A to 9E are sectional views showing a method for forming a PSG film, which comprises a series of steps including a film-forming step, according to a second embodiment of the present invention.

FIG. 9A is a sectional view of a substrate 101 before film formation. The substrate 101 is formed with a base insulating film 12, e.g., a silicon oxidized film, on a silicon substrate (semiconductor substrate) 11, and wiring layers 13a and 13b composed of, e.g., aluminum films, are formed on the base insulating film 12.

In this state, first, the substrate 101 is placed on the substrate. holder in a deposition chamber. Subsequently, the substrate 101 is heated to a temperature in the range of 20 to 400° C.

Figure 9B:
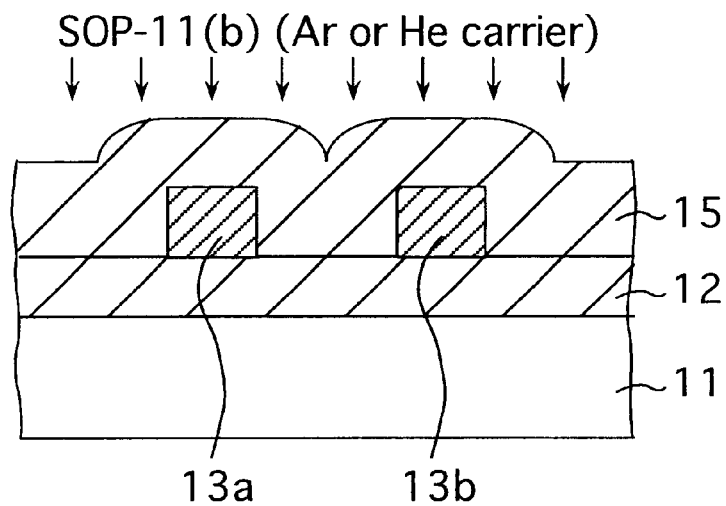

Then, as shown in FIG. 9B, a mixed gas of SOP-11(b)+Ar is introduced into the plasma chamber, with gas pressure maintained at 0.5 to 20 Torr. Ar is used as carrier gas of SOP-11(b). The flow rate of Ar carrier gas containing SOP-11(b) was set in the range of 0.1 to 2 SLM, and the flow rate of added Ar was set in the range of 0.1 to 1 SLM.

Then, power 0 to 300 W at a frequency of 13.56 MHz is applied to the substrate holder, and a bias voltage is applied to the substrate 101. Further, power of 50 to 2.3 kW at a frequency of 13.56 MHz is applied to the upper electrode, and the deposition gas is converted into a plasma.

Accordingly, a reaction occurs in the plasma of the deposition gas, and the deposition of a reaction product on the substrate 101 is started. PSG film 16 during film formation showed flow into a recess between the wiring 13a and 13b even at a substrate temperature of about 200° C. In this case, phosphorus may be contained in the PSG film 16 in the form of III valance $P_2O_3$. Because of lack of supply of oxygen from an external source, the state of an oxygen deficiency is maintained in the reaction system, and Si and P are respectively contained in the PSG film 16 in the form of Si—O and P—O being bonded with oxygen atoms present in the molecules of the deposition gas.

Figure 9C:
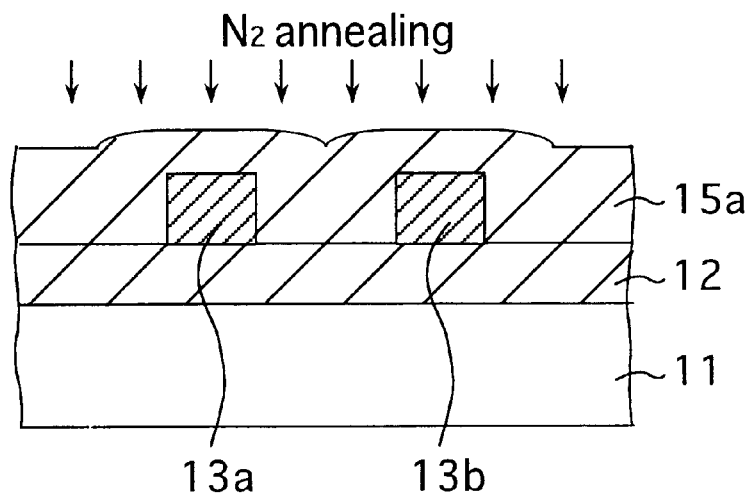

Then, after its removal from the film-forming apparatus, the substrate 101 is conveyed in vacuum or atmosphere, and set in a heat treatment furnace held at the deposition temperature or lower. Subsequently, as shown in FIG. 9C, $N_2$ is introduced into the heat treatment furnace at a flow rate of 10 SLM, and the substrate 101 is heated. The rate of temperature increase is set at about 10° C./min., and after the substrate temperature reaches 650° C., this state is maintained for several minutes. The processing comes to an end about 15 minutes after the start of heating. $N_2$ annealing breaks the glass structure of a formed film 15a, and re-flowing brings about void filling and flattening. In addition, any gaseous component contained: in the formed film 15a is eliminated therefrom during heating, and thus a PSG film 15a having III valance phosphorus is formed.

Figure 9D:
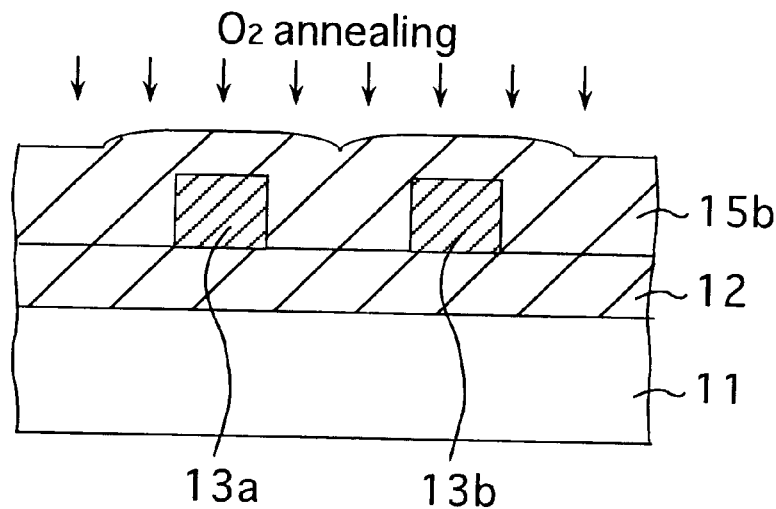

Then, as shown in FIG. 9D, while the substrate temperature is maintained at 650° C., oxygen is introduced at a flow rate of 10 SLM, and the substrate 101 is heated in an oxygen atmosphere for about 15 minutes. III valance phosphorus has very high reactivity, and is prone to be oxidized. Thus, the phosphorus can be converted into stable V valance phosphorus by exposing it to an oxygen atmosphere at a high temperature. In this way, the PSG film 15a containing the unstable III valance phosphorus becomes a PSG film 15b containing stable V valance phosphorus.

As described above, by annealing carried out in an atmosphere containing oxygen after film formation, $P_2O_3$ is converted into $P_2O_5$ to stabilize the PSG film 15b. Moreover, the $P_2O_5$ provides a passivation effect to the PSG film 15b, and contributes to the stabilization of an interface characteristic. Residual carbon in the formed film is simultaneously oxidized by the annealing.

Figure 9E:
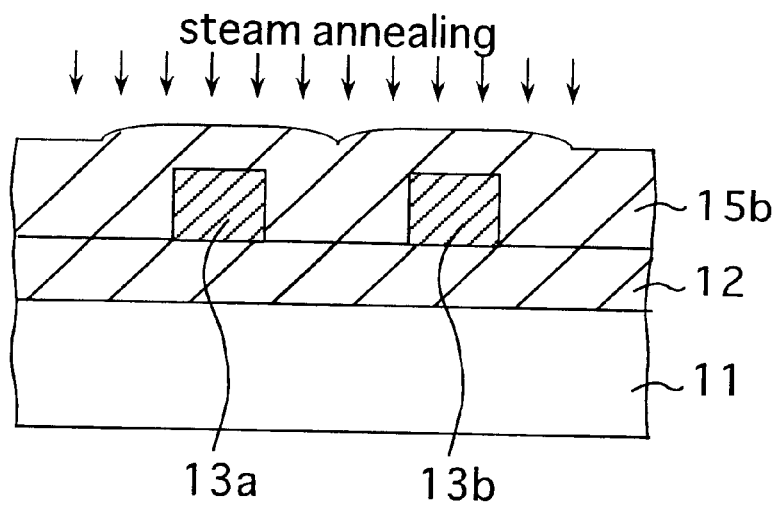

Then, an oxygen flow rate is adjusted to 6 SLM while the substrate temperature is maintained at 650° C., hydrogen is newly added at a flow rate of 5 SLM, and then these gases are introduced through a burning heater into the chamber. The burning heater is heated to 850° C. beforehand. Mixed gas is ignited to cause reaction so as to generate water molecules and, as shown in FIG. 9E, heating is carried out in the atmosphere containing moisture for about 15 minutes. Since the oxidizing force of the heating carried out in the moisture containing atmosphere, i.e., the so-called steam annealing is stronger than that for normal oxygen annealing, film quality can be further improved by oxidizing residual III valance phosphorus, and increasing the moisture absorption resistance. By examination, the reduction in the amount of moisture in the film to about 1/10 was verified. The reason for such a reduction is not yet definite. However, a likely reason may be that the moisture absorbing sites remaining in the network of $SiO_2$ can be greatly reduced by the strong oxidation provided by the steam annealing.

As apparent from the foregoing, according to the second embodiment of the present invention, since insulating films 21 and 15 have a high-concentration of $P_2O_3$ as a phosphorous component, the fluidization temperature can be reduced to 700° C. or much lower. Accordingly, such a film can be used as an interlayer insulating film to cover aluminum wiring. Moreover, even when such a film is used as the base insulating film of a wiring layer in a semiconductor device having a narrower diffused layer and a higher densification, impurities in the diffused layer can be prevented from being re-distributed.

Further, the necessity for a flattening process, such as a CMP method or the like can be eliminated, and the interlayer insulating film can be flattened by thermally fluidizing the formed film. Thus, a recess between the wiring layers can be filled without any gap.

As previously noted, if nitrogen is used as the carrier gas, since $N_2$ is a diatomic molecule, when a film is formed by plasma enhanced vapor deposition, $N_2$ is prone to dissociate, leaving ammonia ($NH_3$) in the formed film. Accordingly, the second embodiment of the present invention also uses an inert gas, e.g., argon or helium, as the carrier gas. Because of the low reactivity of argon and helium, such an interference compound can be prevented from forming.

Further, by using an inert gas as the carrier gas, the concentration of phosphorus was greatly reduced during heat treatment after film formation, enhancing controllability of the concentration of phosphorus.

In addition, by forming a film using only a phosphorus containing compound containing III valance phosphorus, the amount of carbon left in the formed film can be greatly reduced. In this case, the concentration of phosphorus can be adjusted by controlling the ratio of flow rates of the silicon and phosphorus-containing compound and the inert gas in the deposition gas. Thus, the addition of a compound containing silicon but no phosphorus, as is conventional for a deposition gas, was made unnecessary in principle. Also, the compound containing silicon but no phosphorus has Si—C bonding, causing carbon to be left in the formed film. Thus, the amount of such a compound added is preferably as little as possible, but addition thereof may be permitted as occasion demands.

After film formation, the so-called steam annealing is carried out, which heats the. formed film in an atmosphere containing moisture after nitrogen annealing and oxygen annealing. Since the steam annealing has a stronger oxidizing force than that of normal oxygen annealing, the film quality can be further improved.

The invention has been described in detail with reference to the preferred embodiments. However, the scope of the invention is not limited. to the specified embodiments. Various changes and modifications can be made without departing from the gist of the invention, and such changes and modifications are within the scope of the invention.

For example, in the second embodiment, no oxygen is used for the deposition gas. Needless to say, however, as in the case of the first embodiment, by adding oxygen, a melting temperature or a fluidization temperature can be adjusted by controlling the concentration of $P_2O_3$ or the ratio of $P_2O_3/P_2O_5$. In addition, by controlling other deposition parameters, e.g., substrate temperature and the flow rate of inert gas, as in the case of the first embodiment, the melting temperature or fluidization temperature can also be adjusted through the adjustment of a concentration of $P_2O_3$ or the ratio of $P_2O_3/P_2O_5$.

Further, while the PE-CVD method has been described, a TH-CVD method for activating the deposition gas by heat may be used. In this case, for example, the deposition conditions given in Table 7 below can be used.

TABLE 7

TH-CVD Method

| Deposition parameter | Deposition condition |
| --- | --- |
| Substrate temperature | 200 to 400° C. |
| Ozone concentration | 0.3 to 2.5% |
| Gas flow rate of SOP-11(b) | 0.1 to 1.5 slm |
| Gas flow rate of TMB or TEB | 0.1 to 1.0 slm |

Also, in the case of the TH-CVD method, ammonia may be generated when $N_2$ is contained in the deposition gas. However, by not using a compound containing $N_2$ in the deposition gas, the amount of ammonia in the formed film can be reduced to substantially zero.

Instead of the foregoing annealing, or together with annealing, a cover insulating film for moisture absorption prevention may be formed on the PSG film 15b.

As a CVD apparatus, the TH-CVD apparatus or the PE-CVD apparatus is used, and the furnace for annealing is used to improve the film quality. However, in order to enable the film to be reformed without exposure to the atmosphere after film formation, a film forming apparatus wherein the CVD apparatus and the annealing furnace are connected by a load-lock chamber is preferably used.

As is apparent from the foregoing detailed description, the present invention is advantageous in the following respects. Since the PSG film or the BPSG film is formed in a state of oxygen deficiency, a PSG film or BPSG film having a high-concentration of $P_2O_3$ as a phosphorous component can be formed, making it possible to reduce a fluidization temperature to 700° C. or much lower. Thus, such a film can be used as a flattened base film below the wiring layer, or a flattened interlayer insulating film to cover the wiring layer.

Since the interlayer insulating film can be flattened by thermally fluidizing the formed film, a recess between the wiring layers can be filled without any gap.

Inert gas, e.g., argon or helium, is used as carrier gas. Because of the low reactivity of argon and helium, the amount of ammonia in the formed film can be reduced to substantially zero, thus improving film quality.

Furthermore, by using inert gas as a carrier gas, the concentration of phosphorus is greatly reduced during heat treatment after film formation, thereby enhancing controllability of the concentration of phosphorus.

What is claimed is:

1. A film-forming method, comprising the steps of:
preparing a deposition gas containing an inert gas, and a silicon and phosphorus-containing compound having III valance phosphorus in which at least one oxygen is bonded to the phosphorus; and
forming a silicon-containing insulating film containing $P_2O_3$ on a substrate by using said deposition gas.

2. The film-forming method according to claim 1, wherein said silicon and phosphorus-containing compound is selected from the group consisting of:

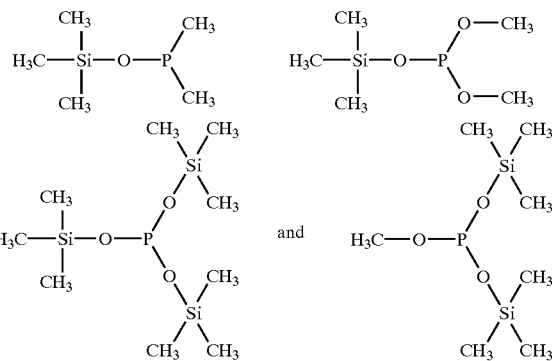

3. The film-forming method according to claim 1, wherein said inert gas is argon (Ar) or helium (He).

4. The film-forming method according to claim 1, wherein said deposition gas contains a silicon compound containing no phosphorus.

5. The film-forming method according to claim 1, wherein said deposition gas contains oxygen atoms.

6. The film-forming method according to claim 1, wherein said deposition gas is excited by conversion into plasma.

7. The film-forming method according to claim 1, wherein said substrate during the film formation is heated to a temperature set in a range of 20 to 400° C.

8. The film-forming method according to claim 1, wherein said silicon containing insulating film containing $P_2O_3$ is a phospho-silicate glass film (PSG film) or a boro-phospho silicate glass film (BPSG film).

9. The film-forming method according to claim 1, wherein after the step of forming said silicon containing insulating film containing $P_2O_3$, said formed film is further heated, fluidized and flattened.

10. The film-forming method according to claim 9, wherein a temperature for heating said formed film is set to 700° C. or lower.

11. The film-forming method according to claim 9, wherein after said formed film is heated, fluidized and flattened, said formed film is further heated in atmosphere containing oxygen, and $P_2O_3$ in said formed film is converted into $P_2O_5$.

12. The film-forming method according to claim 11, wherein after said formed film is heated, and $P_2O_3$ in said formed film is converted into $P_2O_5$, said formed film is further heated in atmosphere containing moisture.

13. The film-forming method according to claim 1, wherein after said silicon containing insulating film containing $P_2O_3$ is formed, said formed film is further heated in atmosphere containing oxygen, and $P_2O_3$ in said formed film is converted into $P_2O_5$.

14. The film-forming method according to claim 13, wherein after said formed film is heated, and $P_2O_3$ in said formed film is converted into $P_2O_5$, said formed film is further heated in atmosphere containing moisture.

15. The film-forming method according to claim 1, wherein said deposition gas is excited by heating.

* * * * *